United States Patent [19]

Colles et al.

[11] 4,330,846
[45] May 18, 1982

[54] DIGITAL TIME BASE CORRECTION

[75] Inventors: Joseph H. Colles, Oceanside; James A. Bixby, San Diego; Gary A. Labeau, LaMesa, all of Calif.

[73] Assignee: Eastman Technology, Inc., Rochester, N.Y.

[21] Appl. No.: 159,421

[22] Filed: Jun. 16, 1980

[51] Int. Cl.³ .............................................. G11B 5/02
[52] U.S. Cl. ....................... 364/900; 360/26; 360/36; 371/1
[58] Field of Search ................ 371/1; 360/26, 36; 364/900

[56] References Cited

U.S. PATENT DOCUMENTS

| | | | |
|---|---|---|---|
| 3,623,004 | 11/1971 | Irwin | 364/900 |
| 3,748,386 | 7/1973 | Monney et al. | 360/26 |
| 3,792,453 | 2/1974 | Smith | 360/26 |
| 3,843,952 | 10/1974 | Husson | 371/1 |
| 3,851,335 | 11/1974 | Elliott | 36/26 |
| 4,024,498 | 5/1977 | McIntosh | 371/1 |
| 4,054,903 | 10/1977 | Ninomiya | 360/36 |
| 4,109,236 | 8/1978 | Besenfelder et al. | 360/26 |
| 4,206,476 | 6/1980 | Hashimoto | 360/36 |
| 4,215,376 | 7/1980 | Mach | 360/36 |
| 4,218,713 | 8/1980 | Horak et al. | 360/36 |

Primary Examiner—Charles E. Atkinson
Attorney, Agent, or Firm—Robert F. Cody

[57] ABSTRACT

The present invention provides apparatus for adjusting the time base of a signal that is read out from an addressable memory device. In accordance with a disclosed embodiment, coarse time base adjustment is provided by controlling the address count produced by a readout counter, while the phase of the counter clocking signal is adjusted to provide fine time base adjustment.

6 Claims, 33 Drawing Figures

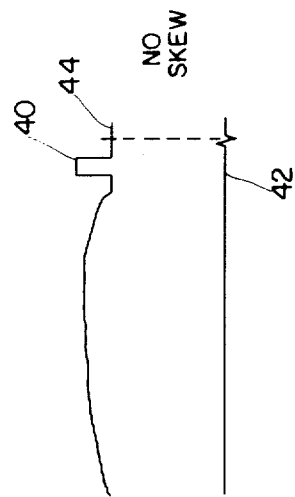
FIG. 2a
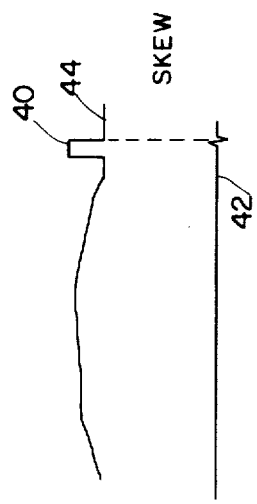
FIG. 2b
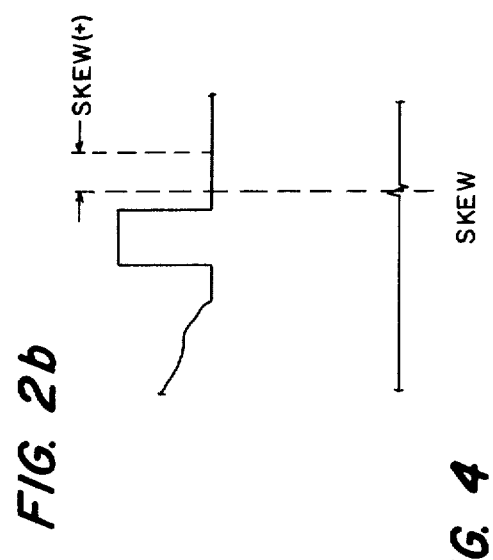
FIG. 4
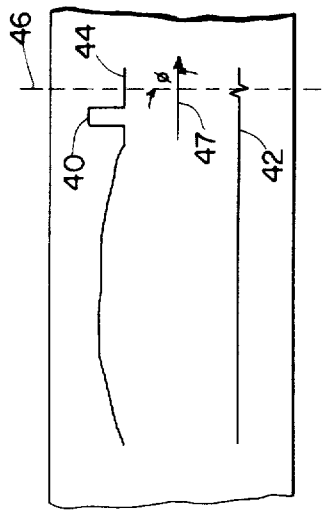
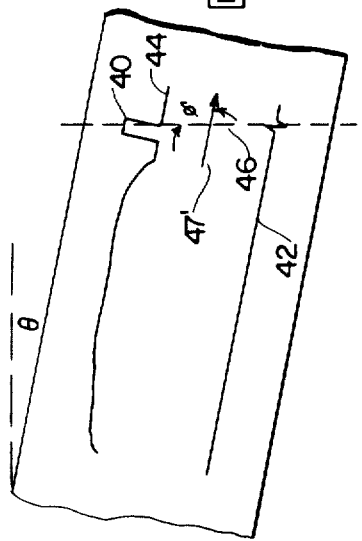

DIGITAL TIME BASE CORRECTION

FIELD OF THE INVENTION

The present invention relates to a technique for reading out a signal from an addressable memory device in such a manner as to apply time base correction thereto.

DESCRIPTION RELATIVE TO THE PRIOR ART

Time base distortion occurs whenever a signal, or a portion thereof, occurs too early or too late relative to a reference time frame. The present invention relates to the correction of such time base distortion. For purposes of teaching its underlying concept, the invention is disclosed herein in the context of skew correction, although it will be apparent from the description which follows that the present invention is not so limited.

In a multi-channel longitudinal recorder, a multi-channel recording head is used to record information signals along a plurality of tracks on a recording medium such as a magnetic tape. The recorded signals are played back by means of a multi-channel playback head. If the recording and playback heads are perfectly aligned, and if the transport system that advances the recording medium does so at a perfectly uniform velocity, the played back signals will represent a faithful reproduction of the originally recorded information signals. Practical systems, however, are not so perfect.

A conventional multi-channel magnetic (recording or playback) head has a stack of aligned transducer gaps. The alignment of such gaps constitutes a "gap line". The recording and playback heads are perfectly aligned when the respective gap lines have the same azimuthal angle (e.g., 90 degrees) with respect to the direction of tape advancement. For various reasons, however, the recording and playback heads in practical systems are often not perfectly aligned. Such misalignment has the effect of producing time base distortion in the form of relative phase errors among the played back information signals.

Time base distortion can also be caused in a magnetic recorder by the tape transport system. Specifically, as the tape advances (during recording or playback) it frequently yaws about an axis perpendicular to the plane of its recording surface, thereby introducing time base distortion in the form of relative phase errors similar to those produced by head misalignment. In this case, however, the "misalignment" varies with the tape yaw as a function of time.

Whether arising from tape yaw or head misalignment, time base distortion in the form of phase errors among information signals recorded and played back through separate channels of a multi-channel longitudinal recorder is hereinafter referred to as "skew".

Various patent references address the matter of skew correction. U.S. Pat. No. 3,526,726 discloses a method of skew correction for use with a multi-channel recorder wherein control signals (e.g., sine waves) from a reference source are recorded on outbound tracks of a magnetic tape. Upon playback, error signals are developed by comparing the phases of the reproduced control signals with the control signals produced by the reference source. Skew correction is obtained by applying the error signals to piezoelectric transducers which support the playback head. The piezoelectric transducers bend in response to the error signals causing the playback head to rotate so as to reduce skew.

U.S. Pat. No. 2,937,239 discloses a skew correction technique wherein the phases of control signals recorded on outbound tracks of a magnetic tape are compared upon playback to produce an error signal indicative of skew. The error signal is applied to a servo system that rotates the playback head in such a manner as to compensate for skew.

SUMMARY OF THE INVENTION

Rather than correct for skew, or other time base error, by means of a servo system, piezoelectric transducers, or the like, the present invention provides a digital processing technique for the correction of time base error. Even though digital in nature, the accuracy of time base correction is not limited by the frequency of digital clocking signals. In accordance with one application of the invention, an information signal to which it is desired to apply time base correction is stored in an addressable memory device. An address count is generated that increments according to a predetermined sequence in response to a clocking signal. The starting address count is based on a time base correction factor, thereby providing time base correction of the information signal to within one cycle of the clocking signal. To provide sub-cycle time base correction, the phase of the clocking signal is made dependent on the time base correction factor, in a manner described below.

BRIEF DESCRIPTION OF THE DRAWINGS

In the detailed description of the preferred embodiments of the invention presented below, reference is made to the accompanying drawings in which:

FIGS. 2a and 2b are diagrams illustrating the concept of skew;

FIG. 4 is a diagram illustrating the concept of skew calculation;

DESCRIPTION OF THE PREFERRED EMBODIMENTS

Figure 1:
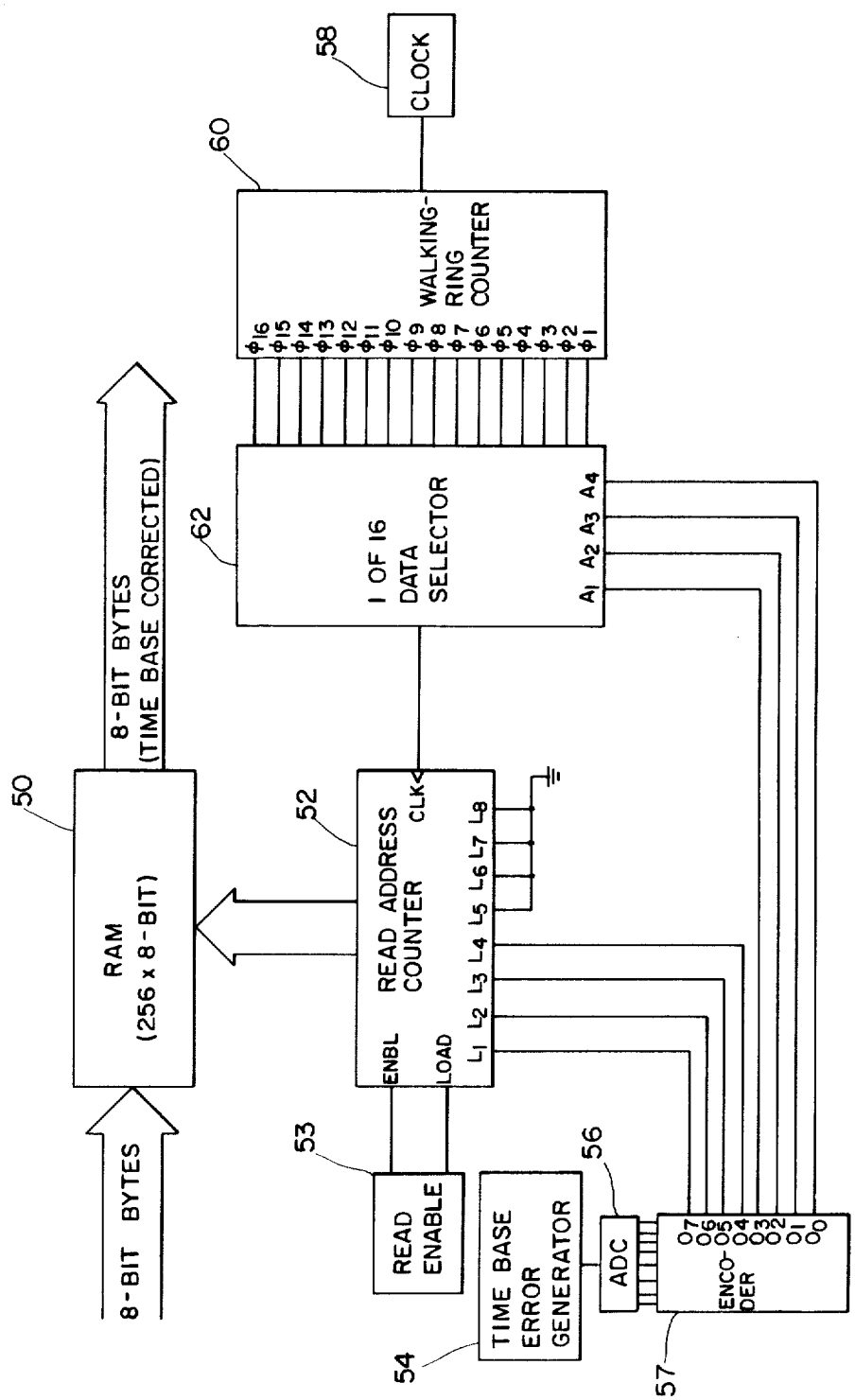
FIG. 1 is an electrical schematic diagram showing a circuit for applying time base correction in accordance with the present invention.

FIG. 1 shows a circuit in accordance with a presently preferred embodiment of the invention for applying a predetermined time base correction factor to an electrical signal. It is assumed that the signal to be time base corrected is comprised of 248 8-bit bytes and is stored in a random access memory (RAM) 50 containing 256 8-bit storage cells. It is further assumed that the 248 bytes of information are stored in storage cells 8 through 255. (The reason for these assumptions is explained below.) The circuitry used to write information in the RAM 50, being well known and forming no part of the present invention, is not shown. Absent time base error, a read enable circuit 53 enables a read address counter 52 at a preset time to increment from 8 to 255, thereby causing information stored in the RAM 50 to be sequentially read out. Depending on the application, the read enable circuit 53 may hold the read address counter 52 in an enabled state, thereby causing the counter 52 to repeatedly cycle from 8 to 255 to provide continuous readout of the RAM 50; or, the read enable circuit 58 may enable the read address counter 52 according to a preset time schedule.

To apply time base correction, a time base error generator 54 (an example of which is discussed in detail below) generates a time base correction factor to be applied to the signal stored in the RAM 50. An analog to digital converter (ADC) 56 encodes the time base correction factor to an 8-bit digital word that is applied to a programmable read-only-memory (PROM) 57. The four output lines $O_4$ through $O_7$ from the PROM 57 are connected to the least significant load inputs ($L_1$ through $L_4$) of the read address counter 52, thereby determining the initial count at which the read address counter 52 addresses the RAM 50. The PROM 57 is programmed such that the load input to the read address counter 52 causes the counter 52 to skip as many storage cells as necessary (up to 16) to correct for time base error to within one cycle of the counter 52 clocking signal. The following Table summarizes the programming of the PROM 57.

TABLE

| Time Base Correction (clock cycles) | | Load Count ($L_1$ through $L_4$) |
|---|---|---|
| delay by: | 8 | 0 |
|  | 7 | 1 |
|  | 6 | 2 |
|  | 5 | 3 |
|  | 4 | 4 |
|  | 3 | 5 |
|  | 2 | 6 |
|  | 1 | 7 |
|  | 0 | 8 |
| advance by: | 1 | 9 |
|  | 2 | 10 |
|  | 3 | 11 |
|  | 4 | 12 |
|  | 5 | 13 |
|  | 6 | 14 |
|  | 7 | 15 |

In general, however, the time base correction factor will not always be a whole number of clock cycles. For example, it may be desired to delay the signal by a time corresponding to $3\frac{1}{8}$ clock cycles. To provide such sub-cycle accuracy, the four output lines $O_0$ through $O_3$ of the PROM 57 are used to control the phase of the clocking signal applied to the read address counter 52. Specifically, the four output lines $O_0$ through $O_3$ of the PROM 52 are used to address a 1 of 16 data selector 62. The inputs to the data selector 62 are sixteen clocking signals having the same frequency but being of different phases. The multi-phase clocking signals are produced by a walking-ring counter 60 that is driven by a clock 58. The data selector address determines which of sixteen phases ($\phi_1$ through $\phi_{16}$) of the clocking signal is selected to drive the read address counter 52. By so controlling the phase of the clocking signal applied to the read address counter 52, time base correction to within one-sixteenth of a clock cycle is obtained (assuming the phases $\phi_1$ through $\phi_{16}$ are evenly spaced throughout the clock cycle).

The above-described time base correction technique is particularly suited to the correction of skew distortion. FIGS. 2a and 2b illustrate the concept of skew distortion in the context of an information signal recorded and played back by a multi-channel longitudinal magnetic recorder. To simplify the discussion, only one recorded information signal 44 and a recorded timing signal 42 are shown. It is assumed for purposes of illustration that no skew distortion was introduced during the recording process. In FIG. 2a, the transducer gap line 46 of the playback head makes an angle $\phi$ of 90 degress with respect to the direction of tape advancement as indicated by the arrow 47. Upon playback, therefore, the phase of the information signal 44 relative to the timing signal 42 remains unchanged. In the case shown in FIG. 2b, however, the transducer gap line 46 makes an angle $\phi'$ that is greater than 90 degrees with respect to the direction of tape advancement because of tape yaw. The result upon playback is to introduce skew distortion in the form of a phase shift between the information signal 44 and the timing signal 42.

It will be noted that the information signal 44 shown in FIGS. 2a and 2b contains a "detectable characteristic" in the form of a pedestal 40. By "detectable characteristic" it is meant that a component in the signal can be detected based upon a distinctive quality relative to the remainder of the signal. An example of a detectable characteristic is the horizontal blanking pulses in a standard line sequential video signal.

Figure 3:
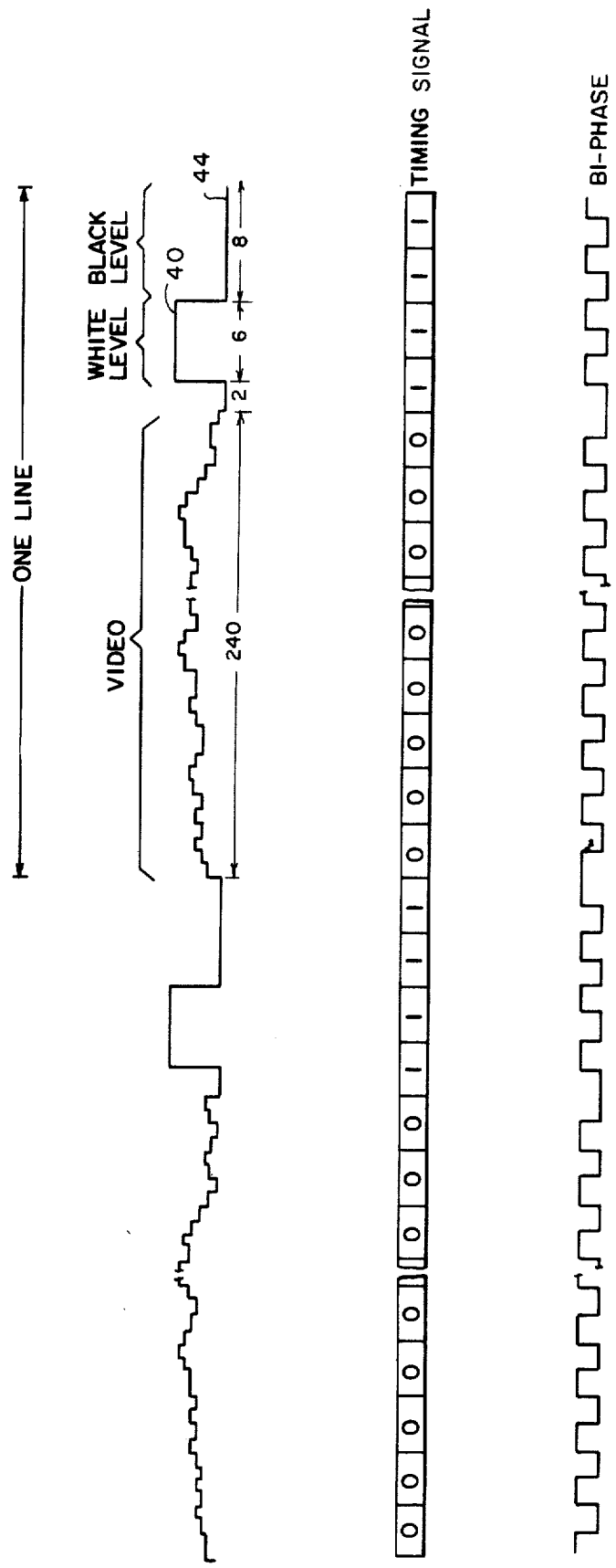
FIG. 3 is a diagram showing the relationship between information in a timing signal and information in a video signal.

The information signal 44 and the timing signal 42 are shown in more detail in FIG. 3. The information signal 44 is a line sequential video signal comprised of 256 picture elements, hereinafter referred to as pixels. Actual video information is carried in the trailing 240 pixels of each line. The detectable characteristic of each line is a white level pedestal 40, six pixels in width, which follows eight pixels of black level. The pedestal 40 is assumed to represent a white level insert but may, alternatively, represent a blanking pulse, or other line-recurring component of the video signal.

The timing signal contains 64 bits of information encoded in bi-phase logic. In bi-phase logic, a zero (low level) is represented by a low to high transition; and a one (high level) is represented by a high to low transition. As is discussed in detail below, bi-phase logic is used so that there will always be a signal transition in the center of each bit. (The bi-phase signal, therefore, will have an average frequency of transitions twice that of the original timing track signal.) Such transitions are used to control both the phase and frequency of a clock that is integral to the disclosed method of skew correction. The first 4 bits of the bi-phase encoded timing signal corresponding to each line of video signal comprise a reference marker code, chosen arbitrarily to be 1111. Each of the remainder of the bits of the timing signal is shown as a zero.

As illustrated in FIG. 4, upon playback, skew distortion is calculated by measuring the time duration between the nominal (no skew) position of the center of the eight pixel black level and its actual position which is determined by detecting the leading edge of the six pixel white level. The "skew" condition shown in FIG. 4 is arbitrarily chosen to represent positive skew, i.e., the information signal has jumped ahead in time. Negative skew occurs in the case (not shown) where the information signal has fallen behind in time.

Figure 5:
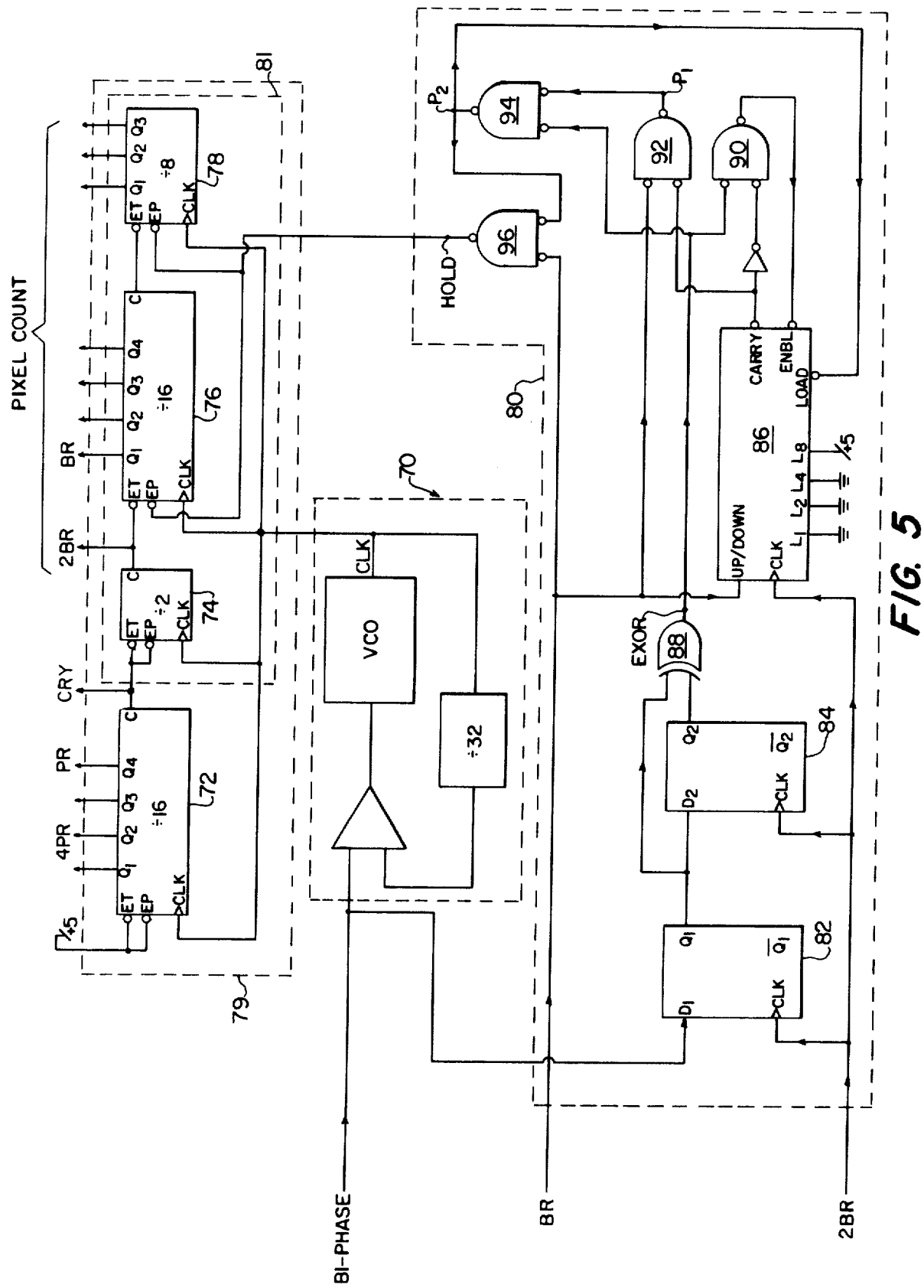
FIG. 5 is an electrical schematic diagram of a counting circuit used in the skew calculation process.
Figure 9:
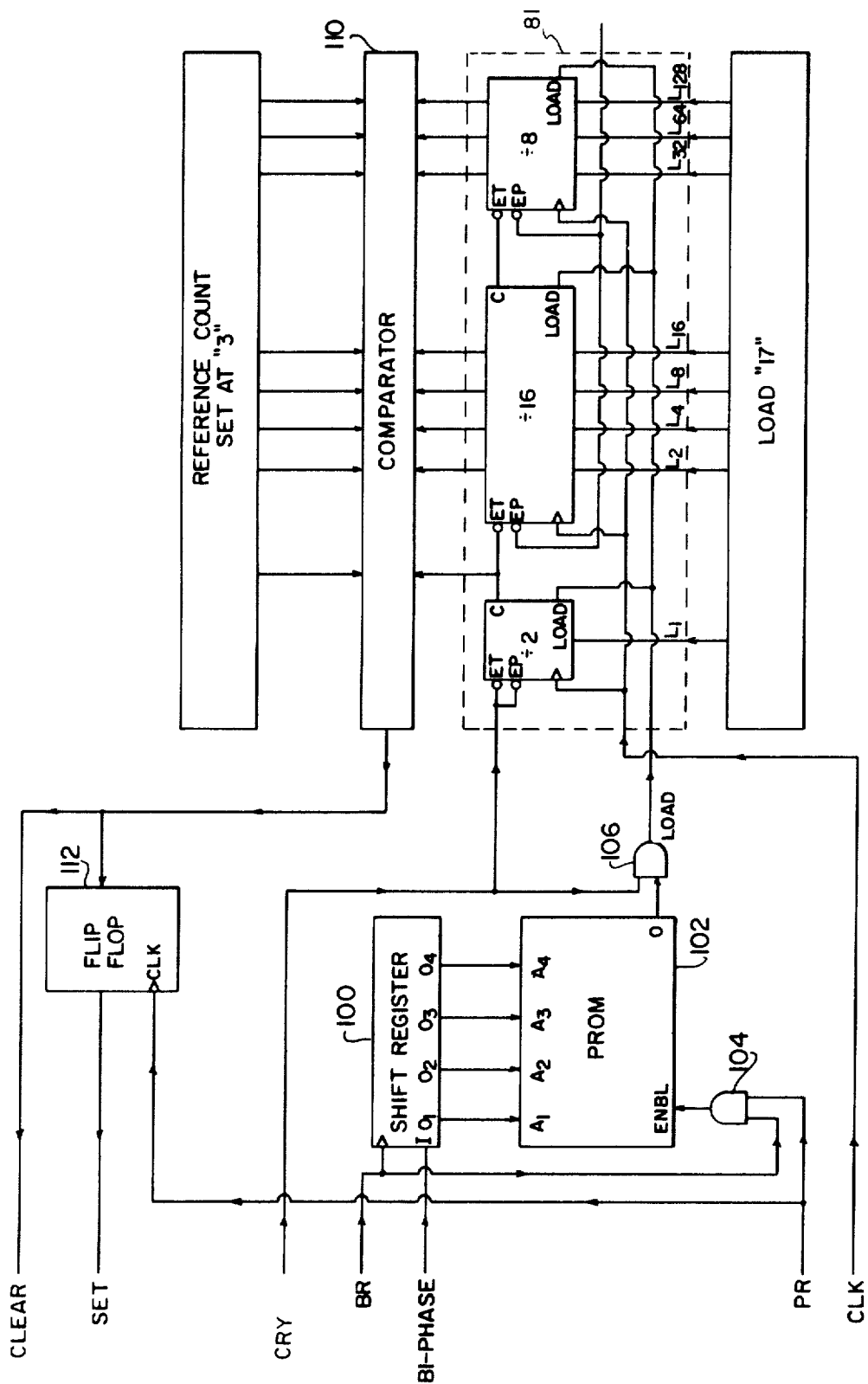
FIG. 9 is an electrical schematic diagram of a circuit that recognizes the occurrence of a reference marker code in a timing signal and causes a preset value to be loaded into a counter that is used in the circuit of FIG. 5.

Referring to FIG. 5, the bi-phase timing signal reproduced upon playback is applied to a phase-lock loop circuit 70 to produce a CLK signal having a frequency that is 32 times higher than the frequency of the incoming bi-phase encoded signal. Because the timing signal has a frequency of transitions twice that of the timing track bit rate, the CLK signal has a frequency 64 times higher than the timing track bit rate. The CLK signal is used to clock a multistage counter 79 comprised of individual counters 72, 74, 76 and 78. (For purposes of clarity, the load inputs to these counters, which are described in connection with FIG. 9, are not shown in FIG. 5.) Because the pixel rate of the video signal is four times faster than the timing track bit rate, the $Q_4$ output line of the counter 72 increments at the pixel rate (PR). Similarly, the carry output signal of the counter 74 counts at twice the timing track bit rate (2BR), while the $Q_1$ output line of the counter 76 counts at the timing track bit rate (BR). These output lines serve as the source for the PR, 2BR and BR clocking signals that are used in certain circuits described below.

Figure 6:
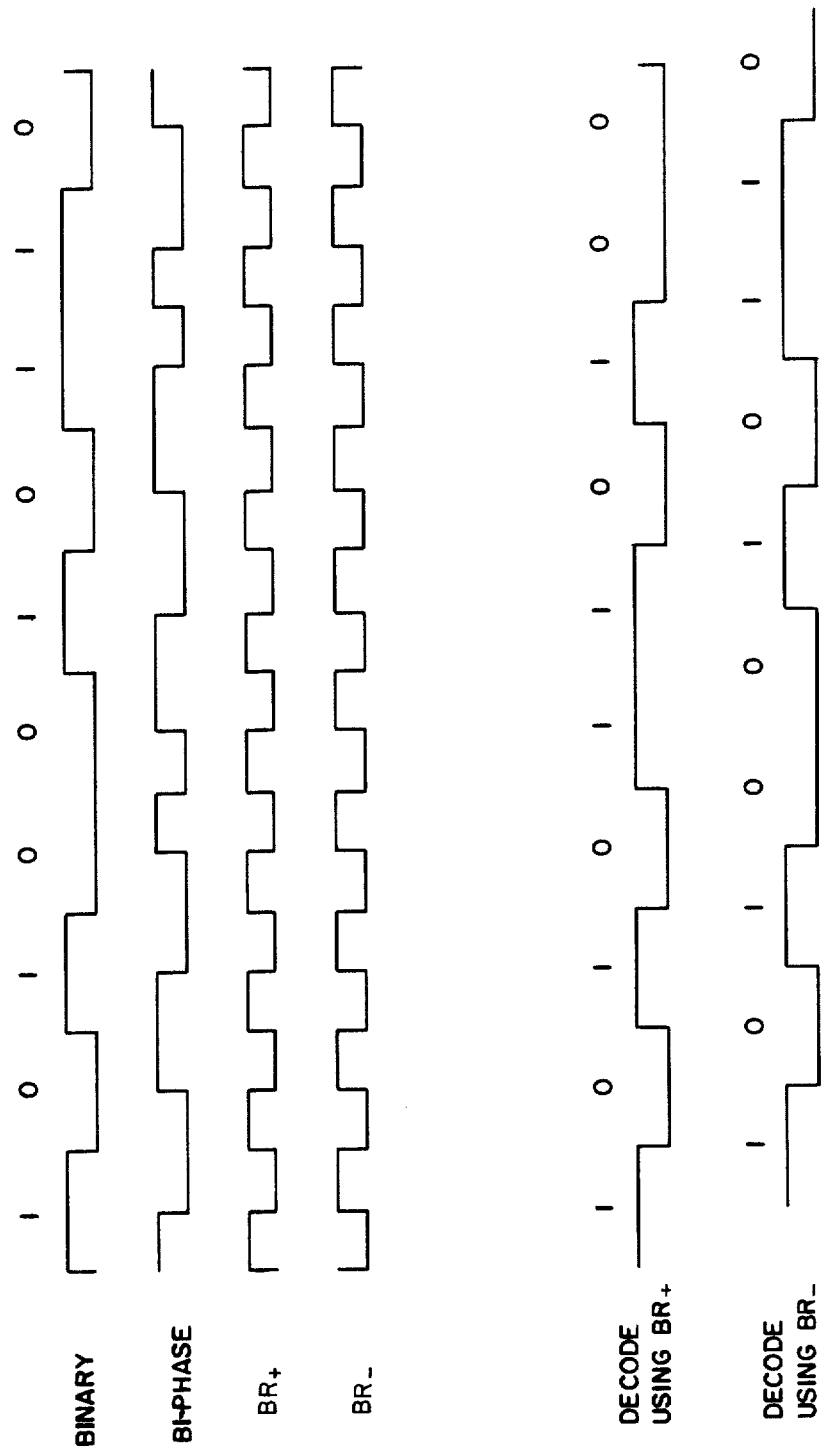
FIGS. 6, 7 and 8 are timing diagrams useful in explaining the operation of the circuits shown in FIG. 5.

The BR clocking signal is used to decode the bi-phase encoded timing signal. While the BR clocking signal has a frequency equal to the timing track bit rate, its phase can take on two values, 180 degrees apart. Unless the phase of the BR clocking signal is such that positive edge transitions (or negative edge transitions, depending on the logic of the decoding circuitry) occur at the center of each timing track bit, proper decoding cannot take place. This concept is illustrated in FIG. 6. A ten digit binary signal, 1010010110, is converted to its bi-phase equivalent. The two possibilities for the BR clocking signal are labeled as $BR_+$ and $BR_-$. It is assumed that the logic of the decoding circuitry (not shown in FIG. 6) is such that the positive-edge (low to high) transition of the BR clocking signal is used for decoding, and that at each positive-edge transition the decoded output takes on the value of the bi-phase signal just prior to the transition. If the $BR_+$ clocking signal is used for decoding, the resultant signal is the ten digit binary number 1010110100, which does not match the originally encoded binary number 1010010110. Using the $BR_-$ clocking signal, however, results in the desired decoded binary number 1010010110.

Figure 7:
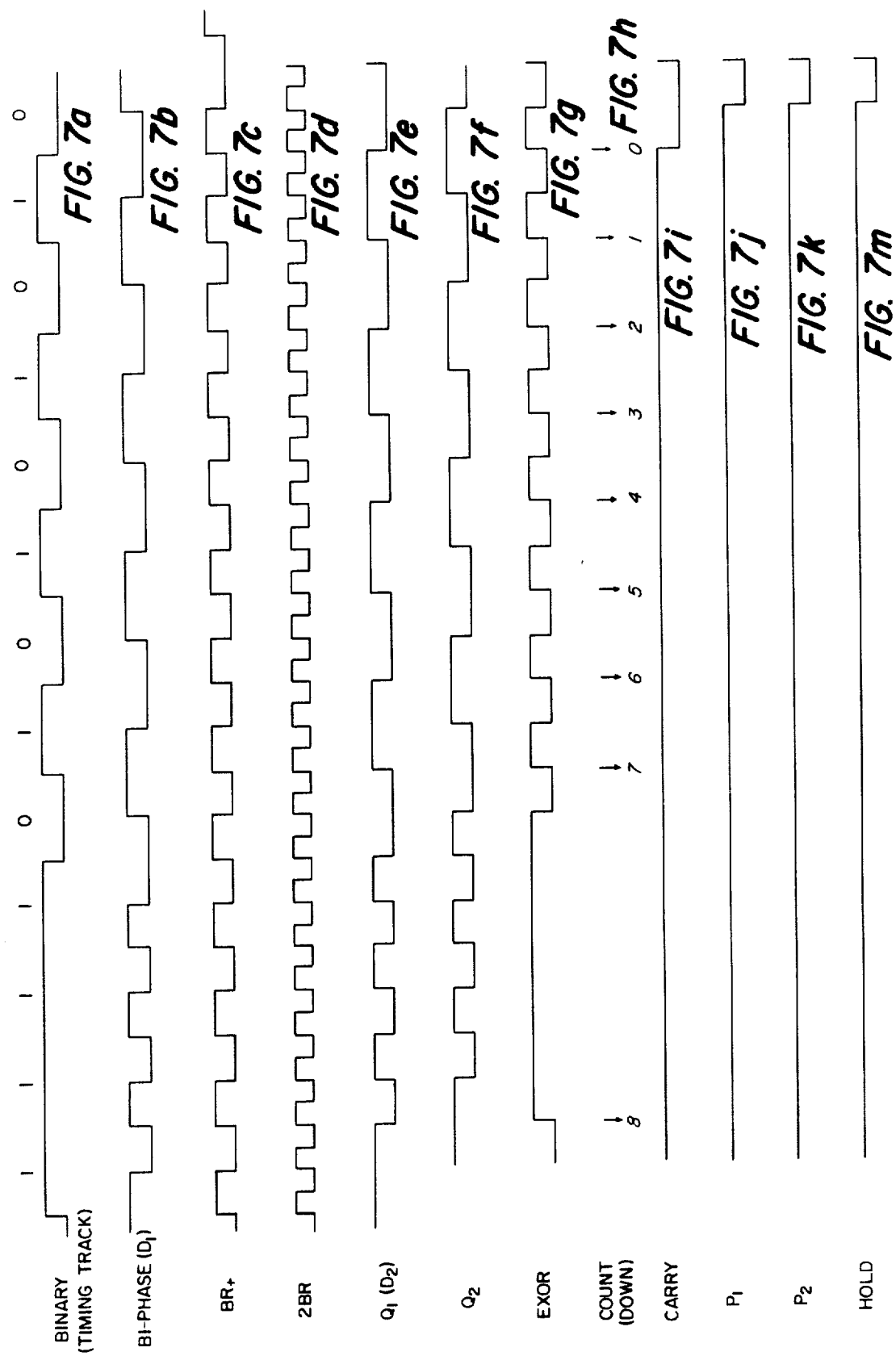

Referring back to FIG. 5, the initial BR clocking signal (of whichever phase) is applied to a sub-circuit 80. The function of the sub-circuit 80 is to determine if the BR clocking signal has the proper phase and, if not, to disable the counters 74, 76 and 78 (hereinafter referred to collectively as a pixel counter 81) for one-half a cycle of the timing track bit rate. Such disablement will shift the phase of the BR clocking signal by 180 degrees to the proper phase. FIGS. 7a through 7m show waveforms at certain points in the sub-circuit 80, assuming an initial $BR_+$ clocking signal (FIG. 7c). A 2BR clocking signal (FIG. 7d) drives a pair of D-type flip-flops 82, 84 and an up/down counter 86. The biphase signal (FIG. 7b) corresponding to the original timing track data (FIG. 7a) is applied to the $D_1$ input line of the flip-flop 82. (For purposes of this discussion, the timing track data contains a reference marker code of 1111 which is followed by a series of data bits that alternate between zero and one.) At each positive edge transition of the 2BR clocking signal, the signal at the $D_1$ input is passed to the $Q_1$ output line of the flip-flop 82 (FIG. 7e). Similarly, at each positive edge transition of the 2BR clocking signal, the signal at the $D_2$ input line of the flip-flop 84 (also FIG. 7e) is passed to the corresponding $Q_2$ output line (FIG. 7f). An exclusive OR gate 88 compares the signals at the $Q_1$ and $Q_2$ output lines, and produces an output signal (EXOR) shown in FIG. 7g.

The counter 86 is initially loaded with a count of eight. If the counter 86 is enabled (by a low logic state), it will count up or down at each positive edge transition of the 2BR clocking signal, depending on whether the BR clocking signal is high or low, respectively. The enable condition is determined by a NAND gate 90 which compares the inverted carry of counter 86 with the output of the exclusive OR gate 88. Because the counter 86 is initially loaded to an eight count, the inverted carry output is low which causes the enable input of the counter 86 to follow the output of the exclusive OR gate 88 (FIG. 7g). The resulting count sequence is shown in FIG. 7h, wherein it is seen that the counter 86 counts down to 0.

When the counter 86 increments to 15, the carry output goes low (FIG. 7i), enabling a NAND gate 92. The output ($P_1$) of the NAND gate 92 thus goes low following the $BR_+$ clocking signal, as shown in FIG. 7j. When the output ($P_1$) of the NAND gate 92 goes low, a NAND gate 94 is enabled, the output ($P_2$) of which (see FIG. 7k) then follows the output (EXOR) of the exclusive OR gate 88. But as the output ($P_2$) of the NAND gate 94 goes low, the counter 86 is reloaded with a count of eight, thereby returning the carry output to the high state (FIG. 7i). This causes the outputs ($P_1$ and $P_2$, respectively) of NAND gates 92 and 94 to return to the high state, as shown in FIGS. 7j and 7k respectively. The sub-circuit 80 is now in its initial state. During the period, however, when the output ($P_2$) of the NAND gate 94 was low (FIG. 7k), the $BR_+$ clocking signal (FIG. 7c) also went low, thereby producing a low going HOLD signal at the output of a NAND gate 96, shown in FIG. 7m. The HOLD signal is low for one-half a cycle of the $BR_+$ clocking signal, and causes the counters 76 and 78 to be disabled for one-half the $BR_+$ cycle. Such disablement causes the phase of the $BR_+$ clocking signal to be shifted by 180 degrees, thereby assuming the phase of the $BR_-$ clocking signal.

Figure 8:
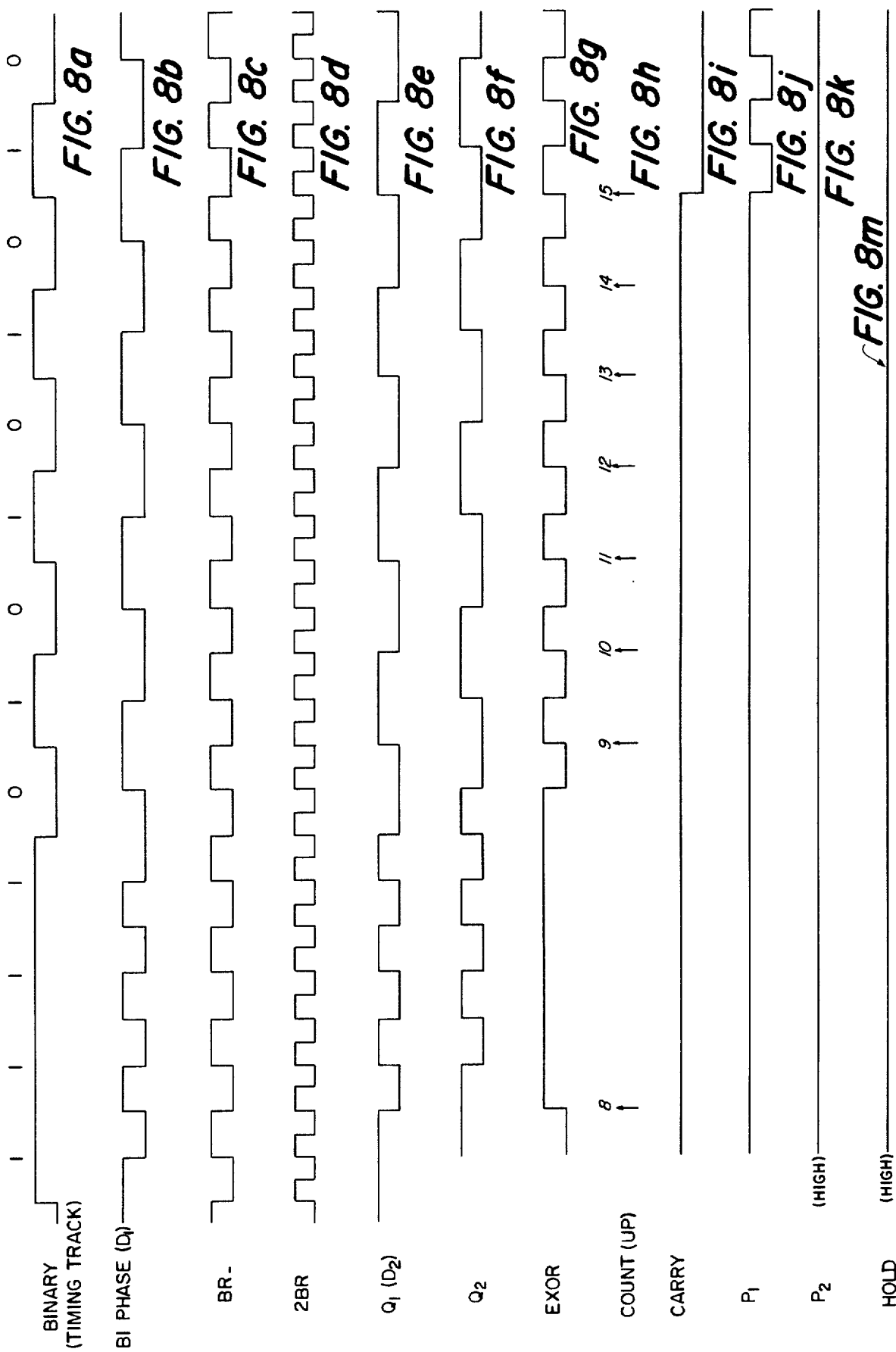

FIGS. 8a through 8m illustrate what happens when the $BR_-$ clocking signal (FIG. 8c) is applied to the sub-circuit 80. All of the other waveforms shown in FIGS. 8a through 8g are identical to those already discussed in connection with FIGS. 7a through 7g, respectively. The counter 86, in this instance however, counts up instead of down (compare FIG. 8h with FIG. 7h) because of the phase difference between the $BR_-$ and $BR_+$ clocking signals. When the counter 86 counts to 15, the carry output goes low (FIG. 8i). This enables the NAND gate 92, thereby causing its output ($P_1$) to go low (FIG. 8i) and follow the BR clocking signal. This time, however, the output ($P_2$) of the NAND gate 94 remains high because, as seen from FIGS. 8g and 8j, at no time are both of its inputs low. Since the output ($P_2$) of the NAND gate 94 stays high, the counter 86 is not re-loaded. As a result, its carry stays high, holding the counter 86 in a disabled condition. It is seen from FIG. 8m that the HOLD signal remains in the high state, thereby permitting the counters 76 and 78 to operate without interference.

To summarize the operation of the sub-circuit 80: By comparing clocking signals with bi-phase encoded timing track data, a HOLD signal is produced. If the clocking signals have an incorrect phase relative to the bi-phase encoded timing track data, the HOLD signal disables the most significant bits of the pixel counter for a time sufficient to correct the phase of the clocking signals. As long as the clocking signals have the proper phase, the sub-circuit 80 has no effect.

The eight bit pixel counter 81 increments from 0 to 255 at the pixel rate. For reasons discussed below, it is necessary to synchronize this count with the location of the pixel that is being reproduced by the playback head, hereinafter identified as the pixel count. Referring to FIG. 9, the bi-phase encoded timing signal is clocked at the bit rate into a serial input, parallel output shift register 100. The data appearing on the shift register output lines $O_1$ through $O_4$ is applied to address lines $A_1$ through $A_4$ of a PROM 102. The BR and PR clocking signals are gated together in an AND gate 104 to produce an enable signal that is applied to the enable input of the PROM 102. The PROM 102 is thus enabled once each bit cycle for a duration equal to one-fourth of the bit cycle. The PROM is programmed such that an output line "0" goes low only when the PROM 102 is addressed with the reference marker code 1111. Because the reference marker code occupies the first four bits of each segment of the timing track that corresponds to a line of video signal, and because the video pixel rate is four times the timing track bit rate, the pixel count is 16 when the reference marker code appears on the address lines $A_1$ through $A_4$ of the PROM 102. The prom output line "0" goes low, therefore, when the pixel count is 16. An AND gate 106 compares the PROM 102 output signal with a carry output signal (CRY) from the counter 72 (shown in FIG. 5). The result is a LOAD signal which goes low during the period in which the output line "0" goes low, but remains low for a duration no greater than one CLK signal period. The low going LOAD signal causes a "17" to be loaded into the pixel counter. The reason a "17" is loaded into the pixel counter is that the counter is not actually loaded until the CRY signal from the counter 72 goes low, and this does not occur until one pixel count after the output of the PROM 102 goes low. Once the pixel counter 81 has been loaded, its count is synchronized with the pixel count.

Because the pixel counter 81 is synchronized with the pixel count that would occur if no skew were present, a count of four marks the nominal position of the middle of the eight pixel black level in each line of video signal. To produce a signal that corresponds to this position, a comparator 110 compares the pixel counter count with a reference count of three. Each time the pixel counter 81 counts to three, the comparator 110 produces a low going output pulse referred to as a CLEAR signal. The CLEAR signal is delayed one pixel count by a flip-flop 112 to produce a SET signal, which marks the nominal center of the eight pixel black level.

Figure 10:
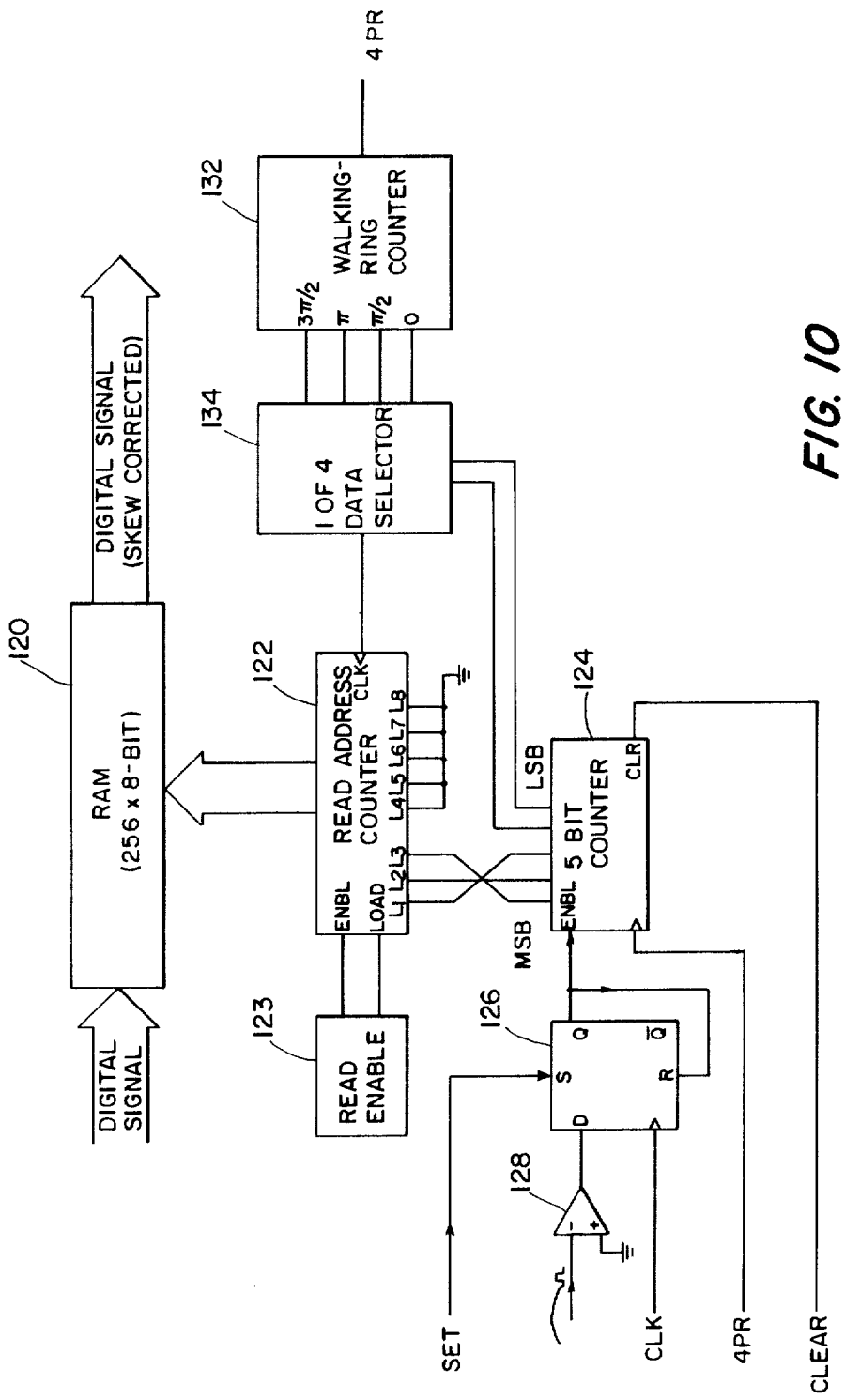
FIG. 10 is an electrical schematic diagram of a circuit that calculates the time base correction factor required to correct for skew and applies such correction factor to the distorted signal.

The circuit shown in FIG. 10 uses the SET and CLEAR signals, the CLK and 4 PR signals, and the video signal to compute the value of skew distortion and to correct for such time base error. The video signal is applied, after inversion, to the D-input line of a D-type flip-flop 126. Because of inversion, the eight pixel black level signal corresponds to a high logic state, while the six pixel white level signal corresponds to a low logic state. When the pixel count reaches three, the CLEAR signal clears a 5-bit counter 124. One pixel count later, the SET signal sets the flip-flop 126 causing its Q output line to go high and enable the counter 124. As a result, the counter 124 starts counting when the pixel count reaches four, which corresponds to the nominal center of the black level signal in the video signal. Because the counter 124 is clocked by the 4PR clocking signal, the counter 124 increments at a rate four times as fast as the pixel rate. This results in calculation of a skew correction value to within one-fourth of a pixel period. The counter 124 continues to increment until the leading edge of the white level signal reaches the D-input of the flip-flop 126, at which time the Q output line goes low and disables the counter 124. If no skew is present, the counter 124 will show a count of 16 (because it would increment for four pixel counts at four times the pixel rate). In the case of positive values of skew, the count will be less than 16 (but greater than or equal to zero), while negative skew will result in a count higher than 16 (but less than or equal to 32).

As shown in FIG. 10, the time base correction circuit described in connection with FIG. 1 has been adapted for use in correcting for skew distortion as measured by the count of the counter 124. Specifically, the video signal (in digital form) is written into a RAM 120. According to a preset time schedule (determined, for example, by horizontal sync pulses) a read enable circuit 123 enables a read address counter 122 to read out the video signal from the RAM 120. The count loaded into the read address counter 122 is determined by the three most significant bits (MSB's) of the 5-bit counter 124. The connections shown in FIG. 10 between the three MSB's of the 5-bit counter 124 and the three least significant load lines of the read address counter 122 produce the following relationship between the count of the counter 124 and the count loaded in the read address counter 122.

TABLE

| Count | | Load Count |
|---|---|---|
| 0 | Skew (+) | 0 |
| 4 | | 1 |
| 8 | | 2 |
| 12 | | 3 |
| 16 | No Skew | 4 |
| 20 | | 5 |
| 24 | | 6 |
| 28 | | 7 |
| 32 | Skew (−) | 8 |

Under no skew conditions, therefore, a count of four is loaded into the read address counter 122. For every four counts (up or down) of the 5-bit counter 124, the load count of the read address counter 122 increments (up or down) by one count. As a result, skew distortion within a range of eight pixel counts is corrected to within one pixel.

To correct for skew distortion to within a fraction of a pixel, the two least significant bits from the counter 124 are applied to a 1 to 4 data selector 134 that adjusts the phase of the clocking signal that drives the read address counter 122. The inputs to the data selector are four clocking signals having a frequency that corresponds to the pixel rate but which differ in phase by $\pi/2$ radians. These signals are produced by applying the 4PR clocking signal to a walking-ring counter 132. By so adjusting the phase of the clocking signal applied to the read address counter 122, skew distortion is corrected to within one-quarter of a pixel.

The invention has been described in detail with particular reference to preferred embodiments thereof, but it will be understood that variations and modifications can be effected within the spirit and scope of the invention. For example, the address count applied to the addressable memory device (such as the RAM 120 shown in FIG. 10) may be developed from a digital device other than a counter, such as a PROM (programmable read-only-memory). The use of a PROM as a read address count generator enables the address count to sequence in a manner other than in accordance with a numerical order.

What is claimed is:

1. Apparatus for use in applying time base correction to an information signal that is stored in an addressable memory device, said apparatus including means for measuring a time base correction factor corresponding to the time disparity between said information signal and a time reference, said apparatus further comprising:
   (a) means for producing a clocking signal;
   (b) an address count generator that produces an address count for use in reading out the information signal from the addressable memory device, said address count being incrementable according to a predetermined sequence in response to the clocking signal;
   (c) means for setting the starting address count of said address count generator based on the time base correction factor; and
   (d) means for adjusting the phase of the clocking signal in response to the time base correction factor, thereby beginning readout of the information signal from the addressable memory device at a time determined by the time base correction factor that is accurate to within a fraction of a cycle of the clocking signal, said starting address setting means including means for loading a starting count into said binary counter, the starting count being determined by the time base correction factor.

2. Apparatus as claimed in claim 1 wherein said phase adjusting means is comprised of:
   means for producing a plurality of phases of the clocking signal; and
   means for selecting one of said plurality of phases in response to said time base correction factor.

3. Apparatus for use in correcting skew distortion of an information signal that is recorded and played back through a given channel of a multi-channel longitudinal recorder, said information signal having a detectable characteristic, said apparatus comprising:
   (a) means for producing a timing signal that is recordable by said multi-channel longitudinal recorder, said timing signal having a reference marker that, before the recording of said timing signal, bears a predetermined time relationship to the detectable characteristic of the information signal;
   (b) means for recording and playing back said timing signal through a different channel of said multi-channel longitudinal recorder;
   (c) means for measuring, upon playback of said timing and information signals, the time relationship between said reference marker of said timing signal and said detectable characteristic of said information signal to produce a time base correction factor indicative of skew distortion;
   (d) an addressable memory device for storing said information signal upon playback by said recording and playback means;
   (e) a read address count generator that produces a read address count for use in reading out said information signal from said addressable memory device, said read address count generator incrementing its count in response to a clocking signal;
   (f) means for determining the starting address count based on said time base correction factor; and
   (g) means for adjusting the phase of the clocking signal in response to said time base correction factor, thereby providing correction of skew distortion to within a fraction of a cycle of said clocking signal.

4. Apparatus as claimed in claim 3 wherein
   said time base correction factor producing means provides a time base correction factor comprised of a plurality of binary bits ranging in significance from least to most;
   said starting address count determining means determines the starting address count based on a first sub-plurality of bits of said time base correction factor; and
   said phase adjusting means adjusts the phase of the clocking signal in response to a second sub-plurality of bits of said time base correction factor, said second sub-plurality of bits being comprised of bits that are less significant than those bits contained in said first sub-plurality of bits.

5. Apparatus as claimed in claim 4 wherein said address count is produced by a binary counter, and wherein said starting address count determining means is effective to load the binary counter with a starting address count determined by said first sub-plurality of bits of said time base correction factor.

6. Apparatus as claimed in claim 5 wherein said phase adjusting means is comprised of
   means for producing a plurality of phases of the clocking signal; and
   means for selecting one of said plurality of phases in response to said second sub-plurality of bits of said time base correction factor.

* * * * *